United States Patent
Kim

(10) Patent No.: US 6,693,827 B2
(45) Date of Patent: Feb. 17, 2004

(54) MEMORY CELL SENSING CIRCUIT CAPABLE OF ENHANCING THE SENSING SPEED

(75) Inventor: Min-Kyu Kim, Ichon-shi (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 163 days.

(21) Appl. No.: 10/024,299

(22) Filed: Dec. 21, 2001

(65) Prior Publication Data

US 2002/0080648 A1 Jun. 27, 2002

(30) Foreign Application Priority Data

Dec. 22, 2000 (KR) .......................... 2000-80432

(51) Int. Cl.[7] .............................. G11C 16/28
(52) U.S. Cl. ..................... 365/185.2; 365/185.21; 365/189.07; 365/210; 365/207; 365/190; 365/233.5
(58) Field of Search ................. 365/207, 208, 365/210, 190, 233.5, 189.07, 185.2, 185.21

(56) References Cited

U.S. PATENT DOCUMENTS 6,278,634 B1 * 8/2001 Ra ........................ 365/185.2
6,584,017 B2 * 6/2003 Maayan et al. ........ 365/185.22

* cited by examiner

Primary Examiner—Andrew Q. Tran
(74) Attorney, Agent, or Firm—Birch, Stewart, Kolasch & Birch, LLP

(57) ABSTRACT

A circuit for sensing a memory cell includes a main cell, a reference cell, a first loading unit for providing a preset voltage to a sensing node of the main cell, a second loading unit for supplying a prescribed voltage to a sensing node of the reference cell, a first switching unit for adjusting the potential of the main cell sensing node, a second switching unit for controlling the potential of the reference cell sensing node, a first voltage controlling unit for adjusting the potential of a bit line of the main cell, a second voltage controlling unit for adjusting the potential of a bit line of the reference cell, and a sense amplifier for sensing a state of the main cell by comparing the potential of the main cell sensing node and that of the reference cell sensing node.

15 Claims, 4 Drawing Sheets

MEMORY CELL SENSING CIRCUIT CAPABLE OF ENHANCING THE SENSING SPEED

RELATED APPLICATIONS

This nonprovisional application claims priority under 35 U.S.C. §119(a) on Patent Application No. 2000-80432 filed in Korea on Dec. 22, 2000, which is herein incorporated by reference.

BACKGROUND OF THE INVENTION

1. Field of the Invention

The present invention relates to memory devices; and, more particularly, to a memory cell sensing circuit of a nonvolatile memory device, e.g., a flash memory device, capable of enhancing its sensing speed.

2. Description of the Background Art

As a flash memory device goes to large-scale integration, its operating voltage gets progressively lower. As a result, when sensing flash memory cells, the sensing current becomes very small. Thus, a problem arises in that it is difficult to sense a memory cell through which a lot of current flows, i.e., a memory cell having a '1' state.

To overcome the drawback, there has been introduced a method for increasing an output gain of a sense amplifier.

Referring to FIG. 1, there is shown a schematic diagram of a conventional flash memory cell sensing circuit.

A first resistor R11 is connected between a supply voltage node Vcc and a first node Q11 being a sensing node of a main cell M11. A first NMOS transistor N11 and the main cell M11 are positioned between the first node Q11, and a ground node Vss. The first NMOS transistor N11 operates in response to an output of a first inverter I11 inverting the potential of a bit line BL1 of the main cell M11. Further, the main cell M11 operates according to a voltage provided through a word line WL.

Meanwhile, a second resistor R12 is attached between the supply voltage node Vcc and a second node Q12, being a sensing node of a reference cell M12. A second NMOS transistor N12 and the reference cell M12 are located between the second node Q12 and the ground node Vss. The second NMOS transistor N12 operates under the control of an output of a second inverter I12 inverting the potential of a bit line BL2 of the reference cell M12. Moreover, the reference cell M12 operates in response to a voltage supplied through the word line WL.

A sense amplifier 11 compares the potential of the first node Q11 being the potential of the main cell M11 and the potential of the second node Q12 being the potential of the reference cell M12, and outputs a comparison result as a sensing output signal SAOUT.

As described above, since the conventional flash memory cell sensing circuit employs a circuit for sensing a state of the main cell, and that being for sensing a state of the reference cell, whose configurations are identical to each other, the state of the main cell can be sensed by the sense amplifier comparing the potential of the main cell on the basis of the potential of the reference cell, and outputting a sensing output signal.

Hereinafter, the operation of the conventional flash memory cell sensing circuit will be explained with reference to the timing diagram illustrated in FIG. 2.

Before a sensing enable signal SAEN having an enable state is coupled to sense a cell state, the bit line BL1 of the main cell M11 and the bit line BL2 of the reference cell M12 are precharged. That is, the supply voltage Vcc is provided to the first node Q11 through the first resistor R11, and the potential of the first node Q11 is transferred to the bit line BL1 of the main cell M11 through the first NMOS transistor N11, so as to precharge the bit line BL1. The first NMOS transistor N11 is turned on since the potential of the bit line BL1 has an initial low state and, thus, the first inverter I11 produces an output having a high state. Then, if the potential of the bit line BL1 becomes higher than a certain level, the first NMOS transistor N11 is turned off in response to its input signal being inverted to a low state by the first inverter I11. As a result, the potential of the bit line BL1 maintains the certain level. The bit line BL2 of the reference cell M12 is also precharged in the same manner as used in precharging the bit line BL1 of the main cell M11.

As depicted above, after the bit line BL1 of the main cell M11 and the bit line BL2 of the reference cell M12 are precharged, if the sensing enable signal SAEN having the enable state, e.g., a high state, is inputted to the memory cell sensing circuit and a word line voltage is provided to the main cell M11, the sensing operation for the main cell M11 is performed. That is to say, if the sensing enable signal SAEN of the enable state is inputted, the potential of the second node Q12, i.e., the potential of the reference cell M12, gradually decreases, and then maintains a constant potential after a prescribed time as indicated by A. In the meantime, the potential of the first node Q11 is changed according to the state of the main cell M11. Namely, the potential of the bit line BL1 maintaining the precharged potential before the sensing enable signal SAEN of the enable state is inputted, becomes lower as the word line voltage is provided to the main cell M11 and, then, ascends again depending on the supply voltage Vcc continuously provided to the circuit, as indicated by B. Next, if the main cell M11 has a '0' state, the potential of the first node Q11 rises as an amount of current flowing to the ground node Vss through the main cell M11 becomes smaller. On the other hand, if the main cell M11 has a '1' state, the potential of the first node Q11 becomes lower since the current is continuously passed to the ground node Vss through the main cell M11. Accordingly, the sensing output signal SAOUT of the sense amplifier 11 is changed and the state of the main cell M11 is sensed.

In the conventional flash memory cell sensing circuit described above, in a case of the main cell having the '0' state, the sensing output signal maintains its state after the sensing, without being changed. On the other hand, in a case of the main cell having the '1' state, the sensing output signal is changed from the '0' state in which current does not flow to the '1' state as the current starts to flow. As a result, the final sensing speed of the device determined by the '1' state sensing is deteriorated and, ultimately, it is inevitable for the sensing speed to be directly affected by the cell current.

Furthermore, in general, the conventional flash memory cell sensing circuit uses a resistor having a high resistance in order to improve the sensing speed. In this case, since the voltage of the sensing node is substantially low during precharging the bit line, the current cannot be provided to the bit line anymore, resulting in making the time required to precharge the bit line longer, and diminishing the sensing speed.

SUMMARY OF THE INVENTION

It is, therefore, a primary object of the present invention to provide a memory cell sensing circuit capable of enhancing a sensing speed by reducing a time required in changing a cell sensing output of a '0' state to that of a '1' state.

In accordance with the present invention, there is provided a memory cell sensing circuit comprising:

a main cell and a reference cell;

a first loading unit for providing a preset voltage to a sensing node of the main cell;

a second loading unit for supplying a prescribed voltage to a sensing node of the reference cell;

a first switching unit for adjusting the potential of the sensing node of the main cell;

a second switching unit for controlling the potential of the sensing node of the reference cell;

a main cell bit line voltage controlling unit for adjusting the potential of a bit line of the main cell;

a reference cell bit line voltage controlling unit for adjusting the potential of a bit line of the reference cell; and a sense amplifier for sensing a state of the main cell by comparing the potential of the sensing node of the main cell and that of the sensing node of the reference cell.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other objects and features of the instant invention will become apparent from the following description of preferred embodiments taken in conjunction with the accompanying drawings which are given by way of illustration only, in which.

DETAILED DESCRIPTION OF THE PREFERRED EMBODIMENTS

Hereinafter, an embodiment of the present invention will be described in detail with reference to the accompanying drawings.

Figure 1:
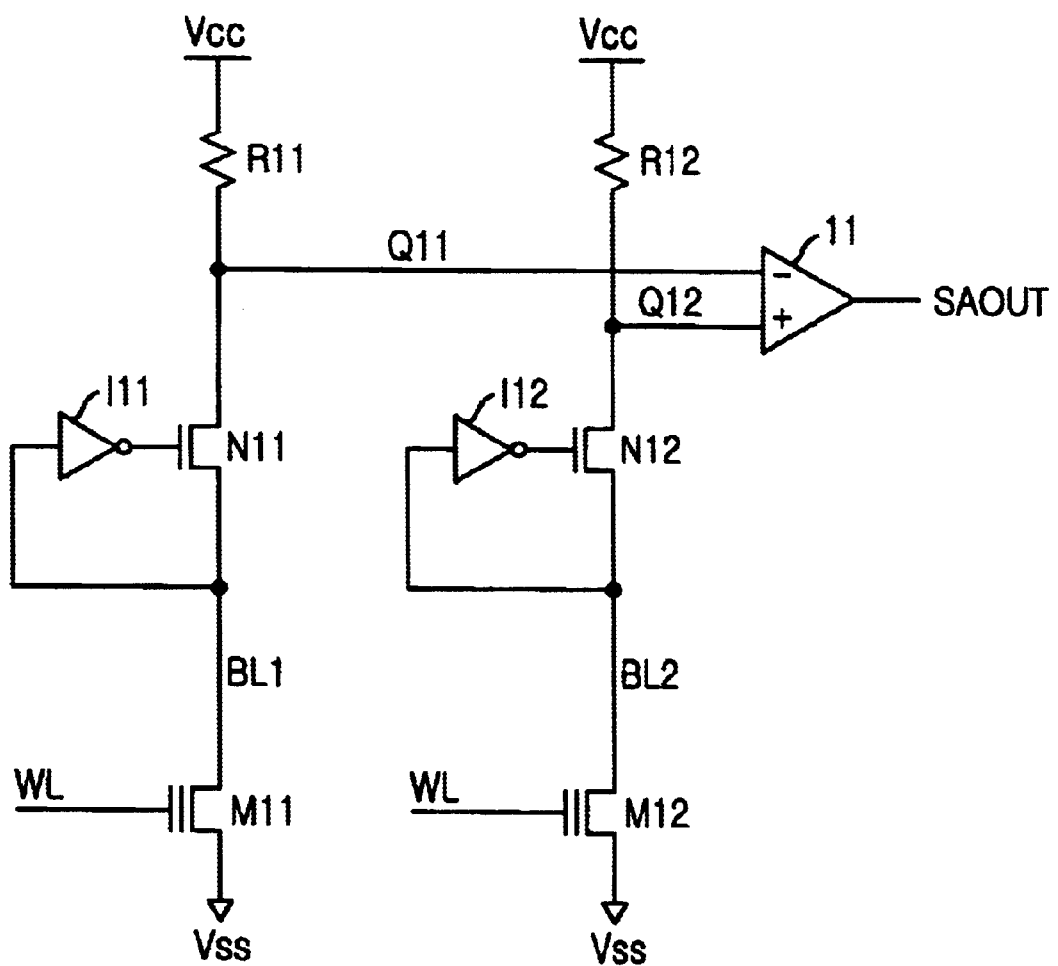
FIG. 1 shows a schematic diagram of a conventional flash memory cell sensing circuit.
Figure 2:
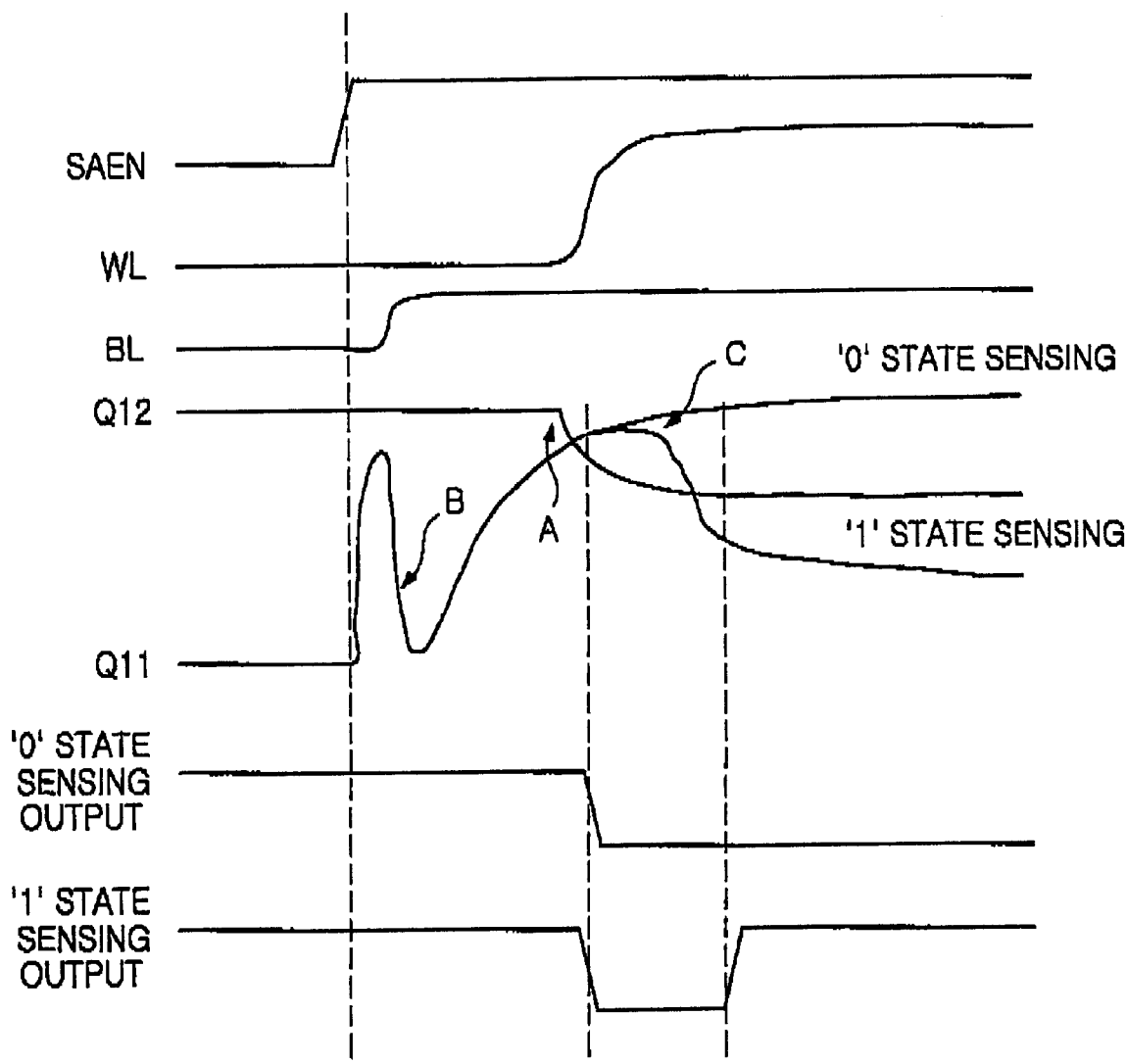
FIG. 2 describes a sensing timing diagram of the conventional sensing circuit in FIG. 1.
Figure 3:
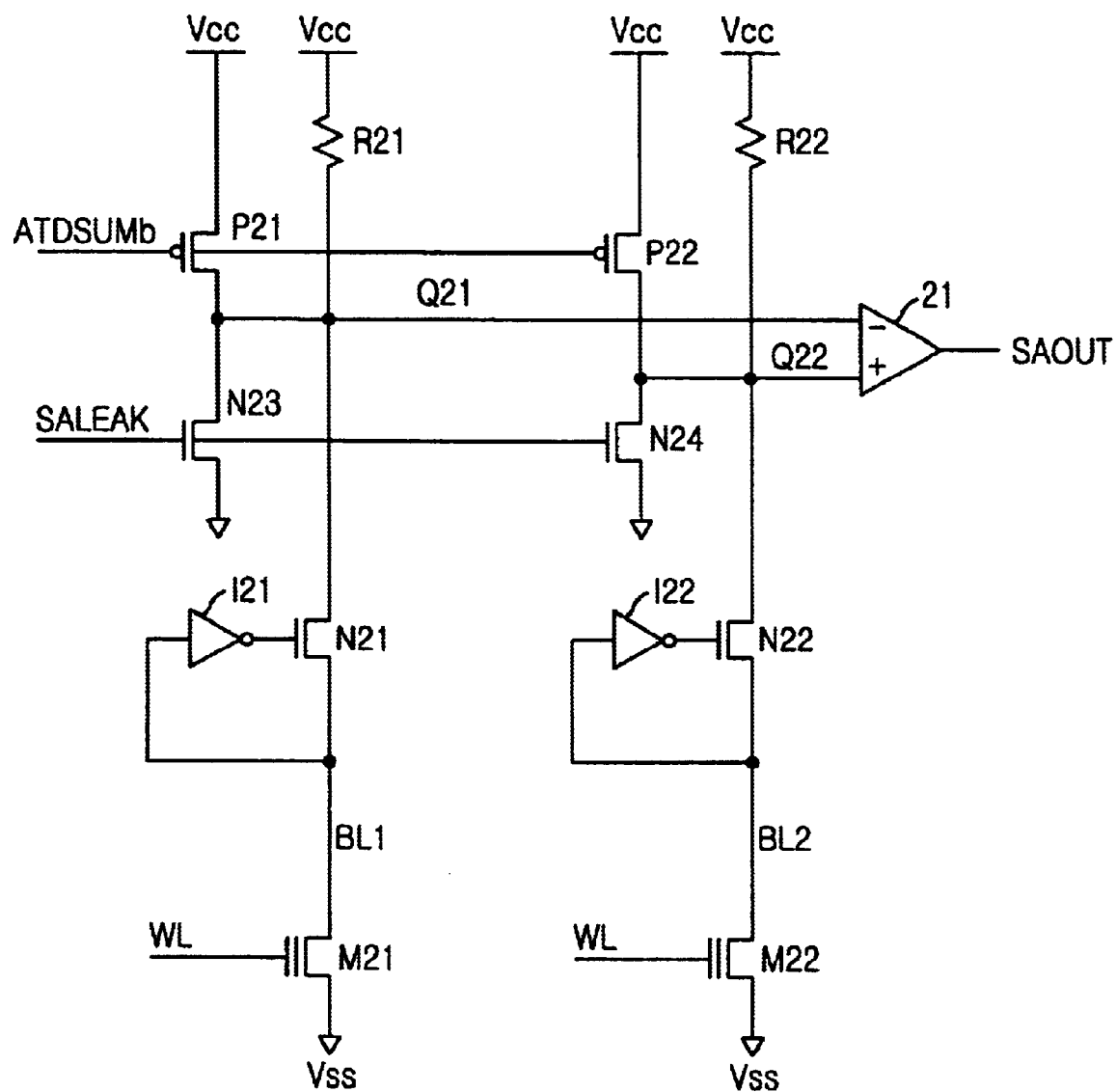
FIG. 3 provides a schematic diagram of a flash memory cell sensing circuit in accordance with the present invention.

Referring to FIG. 3, there is shown a schematic diagram of a flash memory cell sensing circuit in accordance with an embodiment of the present invention.

A first resistor R21 is connected between a supply node Vcc and a first node Q21 being a sensing node of a main cell M21. A first PMOS transistor P21, operating in response to an address transit signal ATDSUMb is connected between the supply voltage node Vcc and the first node Q21. A third NMOS transistor N23 driven depending on a control signal SALEAK is positioned between the first node Q21 and a ground node Vss. There are connected a first NMOS transistor N21 and the main cell M21 between the first node Q21 and the ground node Vss. The first NMOS transistor N21 operates in response to an output of a first inverter I21 inverting the potential of a bit line BL1 of the main cell M21. The main cell M21 operates under the control of a certain voltage provided through a word line WL.

Meanwhile, a second resistor R22 is attached between the supply voltage node Vcc and a second node Q22 being a sensing node of a reference cell M22. A second PMOS transistor P22 driven in response to the address transit signal ATDSUMb is located between the supply voltage node Vcc and the second node Q22. A fourth NMOS transistor N24 operating in response to the control signal SALEAK is connected between the second node Q22 and the ground node Vss. Further, there are attached a second NMOS transistor N22 and the reference cell M22 between the second node Q22 and the ground node Vss. The second NMOS transistor N22 operates responsive to an output of a second inverter I22 inverting the potential of a bit line BL2 of the reference cell M22. The reference cell M22 operates under the control of a certain voltage provided through the word line WL.

A sense amplifier 21 receives and compares the potential of the first node Q21 being the potential of the main cell M21, and the potential of the second node Q22 being the potential of the reference cell M22, to thereby produce a sensing output signal SAOUT of the main cell M21.

As illustrated above, since the inventive flash memory cell sensing circuit employs a circuit for sensing a state of the main cell M21, and that for sensing a state of the reference cell M22 whose configurations are identical to each other, the state of the main cell M21 can be sensed by the sense amplifier comparing the potential of the main cell M21 on the basis of the potential of the reference cell M22 and outputting a comparison result as the sensing output signal SAOUT.

Figure 4:
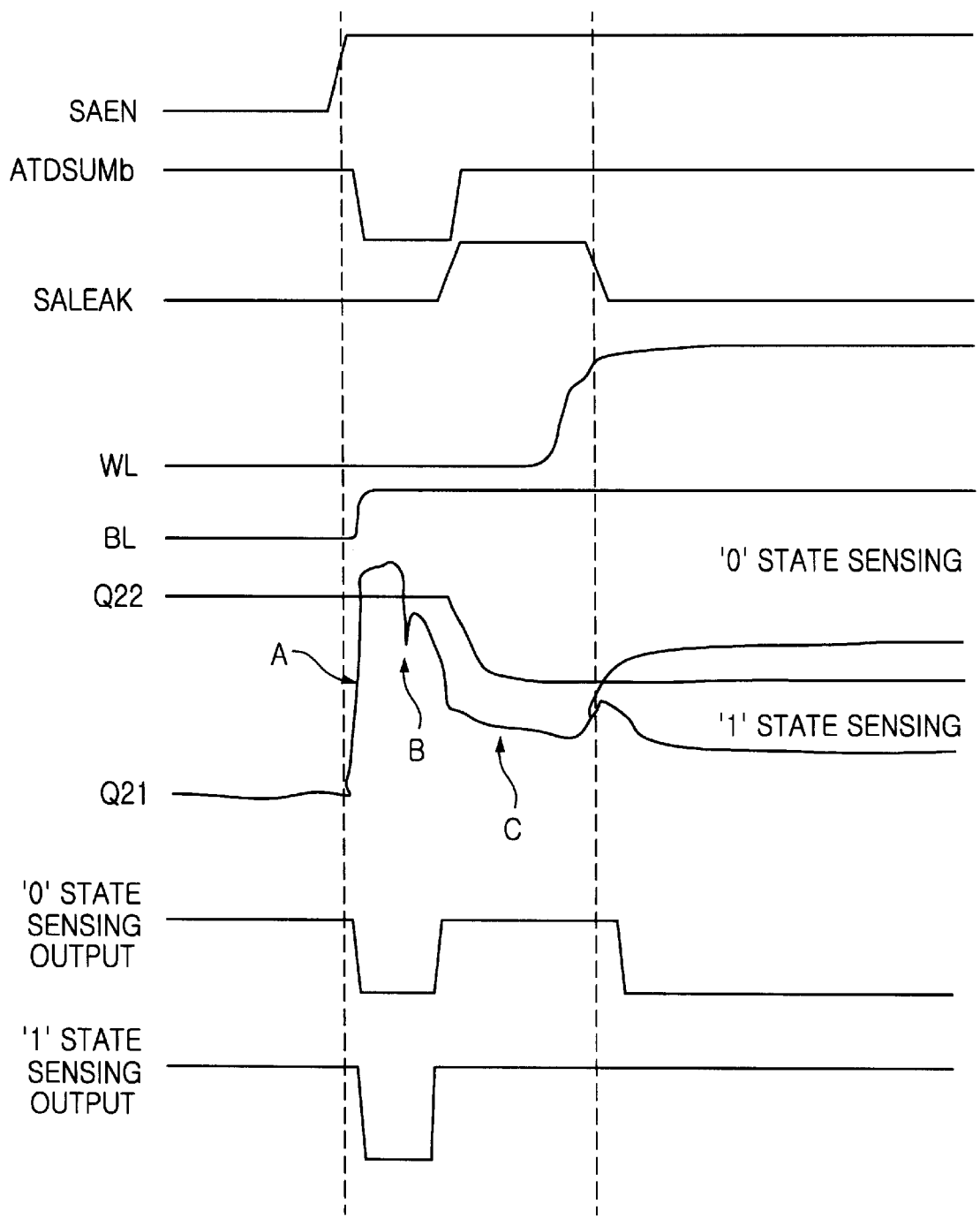
FIG. 4 is a sensing timing diagram of the sensing circuit in FIG. 3.

The operation of the inventive flash memory cell sensing circuit will be described with reference to a timing diagram shown in FIG. 4 herein below.

Before a sensing enable signal SAEN having an enable state is coupled to sense a cell state, the bit line BL1 of the main cell M21 and the bit line BL2 of the reference cell M22 are precharged. That is, if the sensing enable signal SAEN, the address transit signal ATDSUMb and the control signal SALEAK are inputted in a disabled low state, a high state and a low state, respectively, the supply voltage Vcc is provided to the first node Q21 via the first resistor R21 and the bit line BL1 of the main cell M21 is precharged by the potential of the first node Q21 through the first NMOS transistor N21. At first, the first NMOS transistor N21 is turned on since the potential of the bit line BL1 has an initial low state and, thus, the first inverter I21 generates an output having a high state. Then, if the potential of the bit line BL1 becomes higher than a certain level, the output of the first inverter I21 is transitioned to a low state and, thus, the first NMOS transistor N21 is turned off. As a result, the potential of the bit line BL1 of the main cell M21 maintains the certain level. The bit line BL2 of the reference cell M22 is precharged in the same manner as used in precharging the bit line BL1 of the main cell M21.

After then the bit lines BL1 and BL2 of the main cell M21 and the reference cell M22 are precharged as described above, the sensing enable signal SAEN and the address transit signal ATDSUMb are coupled in an enabled high state and a low state, respectively. As a result, the first and the second PMOS transistor P21 and P22 are turned on and the supply voltage Vcc is provided to the first and the second node Q21 and Q22, so that the potential of the first and the second nodes Q21 and Q22 rise and, thus, the potential of the bit line BL1 of the main cell M21 also rises to a prescribed level. That is, since the supply voltage Vcc is provided through the first PMOS transistor P21 in a condition of the bit line BL1 of the main cell M21 precharged, the potential of the bit line BL1 of the main cell M21 further rises as much as the supply voltage Vcc (as indicated by A). The potential of the bit line BL1 of the main cell M21 rises to the prescribed level and, then, falls again since it cannot rise anymore by the operation of the first NMOS transistor N21 as indicated by B. At this time, the sense amplifier 21 produces a sensing output signal SAOUT having a low state identical to a sensing output signal generated when the main cell M21 is in a '0' state. Namely, during the address transit signal ATDSUMb having the enable state is inputted, the potential of the first and the second node Q21 and Q22 rise and, correspondingly, the sense amplifier 21 outputs a sensing output signal SAOUT having a low state determined by sensing a '0' state of the main cell M21.

If the state of the address transit signal ATDSUMb transited to a high state is coupled and, at the same time, the control signal SALEAK of a high state is inputted, the third and the fourth NMOS transistor N23 and N24 are turned on in response to the control signal SALEAK of the high state and, thus, the potential of the first and the second node Q21 and Q22 gradually fall (as indicated by C). Accordingly, the sense amplifier 21 produces a sensing output signal having a high state determined by sensing a '1' state of the main cell M21.

If the control signal SALEAK transited to a low state is inputted and the word line voltage is coupled, the main cell is sensed. That is, in case the main cell M21 has a '0' state, as the current flowing to the ground node Vss through the main cell M21 gets smaller, the potential of the first node Q21 becomes higher than that of the second node Q22. On the other hand, in a case of the main cell M21 having a '1' state, since the current continuously flows to the ground node Vss through the main cell M21, the potential of the first node Q21 becomes lower than that of the second node Q22. As a result, the sensing output signal SAOUT of the sense amplifier 21 is determined according to the potential difference between the first node Q21 and the second node Q22 and the state of the main cell M21 is sensed.

In accordance with another embodiment of the present invention, the flash memory cell sensing circuit employs only the first and the second PMOS transistor P21 and P22 connected between the supply voltage node Vcc and the first and the second node Q21 and Q22 or the third and the fourth NMOS transistor N23 and N24 attached between the first and the second node Q21 and Q22, and the ground node Vss, instead of the first and the second PMOS transistor P21 and P22 and the third and the fourth NMOS transistor N23 and N24 illustrated in FIG. 3.

In accordance with still another embodiment of the present invention, the flash memory cell sensing circuit includes a third resistor and the third NMOS transistor N23 connected in series between the first node Q21 and the ground node Vss and a fourth resistor and the fourth NNOS transistor N24 attached in series between the second node Q22 and the ground node Vss, instead of the first and the second PMOS transistor P21 and P22 and the third and the fourth NMOS transistor N23 and N24 described in FIG. 3.

In accordance with further still another embodiment of the present invention, the flash memory cell sensing circuit contains the first PMOS transistor P21 connected between the supply voltage node Vcc and the first node Q21, a third resistor and the third NMOS transistor N23 attached in series between the first node Q21 and the ground node Vss, the second PMOS transistor P22 connected between the supply voltage node Vcc and the second node Q22 and a fourth resistor, and the fourth NMOS transistor N24 attached in series between the second node Q22 and the ground node Vss instead of the first and the second PMOS transistor P21 and P22 and the third and the fourth NMOS transistor N23 and N24 shown in FIG. 3.

As described above, by sensing the flash memory cell through the use of the inventive flash memory cell sensing circuit, it is possible to substantially improve data reading speed, which is a dominant factor in determining the performance of a flash memory device essentially requiring low power operation. That is, in accordance with the present invention, by terminating a data reading operation at a moment when an output signal sensing a '1' state is changed to an output signal sensing a '0' state only for a memory cell having a '0' state, it is possible to reduce an influence of the cell current necessarily required in sensing a '1' state of a memory cell and guarantee a constant sensing speed. Therefore, in a case of designing a memory device by using the inventive memory cell sensing circuit, an improved sensing speed can be guaranteed although a cell size is much smaller, i.e., the cell current is smaller and, as a result, the performance of the memory device can be enhanced.

While the present invention has been described with respect to the particular embodiments, it will be apparent to those skilled in the art that various changes and modifications may be made without departing from the spirit and scope of the invention as defined in the following claims.

What is claimed is:

1. A memory cell sensing circuit comprising:

a main cell and a reference cell;

a first loading unit for providing a preset voltage to a sensing node of the main cell;

a second loading unit for supplying a prescribed voltage to a sensing node of the reference cell;

a first switching unit for adjusting the potential of the sensing node of the main cell;

a second switching unit for controlling the potential of the sensing node of the reference cell;

a main cell bit line voltage controlling unit coupled to the sensing node of the main cell, for adjusting the potential of a bit line of the main cell;

a reference cell bit line voltage controlling unit coupled to the sensing node of the reference cell, for adjusting the potential of a bit line of the reference cell; and a sense amplifier for sensing a state of the main cell by comparing the potential of the sensing node of the main cell and that of the sensing node of the reference cell.

2. The memory cell sensing circuit of claim 1, wherein the first loading unit includes a resistance connected between a supply voltage node and the sensing node of the main cell.

3. The memory cell sensing circuit of claim 1, wherein the second loading unit includes a resistance attached between a supply voltage node and the sensing node of the reference cell.

4. The memory cell sensing circuit of claim 1, wherein the first switching unit includes a PMOS transistor connected between a supply voltage node and the sensing node of the main cell, and operating in response to an address transit signal.

5. The memory cell sensing circuit of claim 4, wherein the second switching unit includes a second PMOS transistor connected between the supply voltage node and the sensing node of the reference cell, and operating in response to the address transit signal.

6. The memory cell sensing circuit of claim 1, wherein the main cell bit line voltage controlling unit includes:

an inverting unit for inverting the potential of the bit line of the main cell; and an NMOS transistor connected between the sensing node of the main cell and the bit line of the main cell, and operating in response to an output signal of said inverting unit.

7. The memory cell sensing circuit of claim 1, wherein the reference cell bit line voltage controlling unit includes:

an inverting unit for inverting the potential of the bit line of the reference cell; and an NMOS transistor connected between the sensing node of the reference cell and the bit line of the reference cell and operating in response to an output signal of said inverting unit.

8. The memory cell sensing circuit of claim 1, wherein the first switching unit employs an NMOS transistor attached between the sensing node of the main cell and a ground node, and operating in response to a control signal.

9. The memory cell sensing circuit of claim 8, wherein the second switching unit employs a second NMOS transistor connected between the sensing node of the reference cell and the ground node, and operating in response to the control signal.

10. The memory cell sensing circuit of claim 1, wherein the first switching unit includes:

a PMOS transistor connected between a supply voltage node and the sensing node of the main cell and operating in response to an address transit signal; and an NMOS transistor attached between the sensing node of the main cell and a ground node and operating in response to a control signal.

11. The memory cell sensing circuit of claim 10, wherein the second switching unit includes:

a second PMOS transistor connected between the supply voltage node and the sensing node of the reference cell, and operating in response to the address transit signal; and a second NMOS transistor attached between the sensing node of the reference cell and the ground node, and operating in response to the control signal.

12. The memory cell sensing circuit of claim 1, wherein the first switching unit employs a resistance and an NMOS transistor connected in series between the sensing node of the main cell and a ground node, the NMOS transistor being controlled by a control signal.

13. The memory cell sensing circuit of claim 12, wherein the second switching unit employs a second resistance and a second NMOS transistor connected in series between the sensing node of the reference cell and the ground node, the second NMOS transistor operating in response to the control signal.

14. The memory cell sensing circuit of claim 1, wherein the first switching unit includes:

a PMOS transistor connected between a supply voltage node and the sensing node of the main cell; and a resistance and an NMOS transistor connected in series between the sensing node of the main cell and a ground node, wherein the NMOS transistor operates in response to a control signal.

15. The memory cell sensing circuit of claim 14, wherein the second switching unit includes:

a second PMOS transistor connected between the supply voltage node and the sensing node of the reference cell; and a second resistance and a second NMOS transistor connected in series between the sensing node of the reference cell and the ground node, wherein the second NMOS transistor operates in response to the control signal.

* * * * *